United States Patent
Zhan et al.

(10) Patent No.: US 10,214,812 B2
(45) Date of Patent: Feb. 26, 2019

(54) CUTTER ELEMENTS FOR DRILL BITS AND METHODS FOR FABRICATING SAME

(71) Applicant: National Oilwell DHT, L.P., Conroe, TX (US)

(72) Inventors: Guodong Zhan, The Woodlands, TX (US); Biju Pillai Kumar, Pasadena, TX (US); Russell C. Gilleylen, Spring, TX (US); Michael D. Hughes, Spring, TX (US); Xinhua Liang, Rolla, MO (US)

(73) Assignee: NATIONAL OILWELL DHT, L.P., Conroe, TX (US)

( * ) Notice: Subject to any disclaimer, the term of this patent is extended or adjusted under 35 U.S.C. 154(b) by 0 days.

(21) Appl. No.: 15/568,406

(22) PCT Filed: May 13, 2016

(86) PCT No.: PCT/US2016/032343
§ 371 (c)(1),
(2) Date: Oct. 20, 2017

(87) PCT Pub. No.: WO2016/183435
PCT Pub. Date: Nov. 17, 2016

(65) Prior Publication Data
US 2018/0100234 A1    Apr. 12, 2018

Related U.S. Application Data

(60) Provisional application No. 62/160,793, filed on May 13, 2015.

(51) Int. Cl.
*C23C 16/44* (2006.01)
*C23C 16/455* (2006.01)
*E21B 10/567* (2006.01)

(52) U.S. Cl.
CPC .... *C23C 16/4417* (2013.01); *C23C 16/45555* (2013.01); *E21B 10/567* (2013.01)

(58) Field of Classification Search
None
See application file for complete search history.

(56) References Cited

U.S. PATENT DOCUMENTS

| | | | | |
|---|---|---|---|---|
| 7,629,291 B2 * | 12/2009 | Dai | ........................... | B01J 23/52 502/208 |
| 8,875,813 B2 | 11/2014 | Zhan et al. | | |
| 2003/0026989 A1 | 2/2003 | George et al. | | |
| 2008/0073127 A1* | 3/2008 | Zhan | ........................ | B24D 3/02 51/295 |
| 2008/0302579 A1* | 12/2008 | Keshavan | .................. | B22F 7/08 175/434 |
| 2009/0269507 A1* | 10/2009 | Yu | ..................... | H01L 21/02074 427/535 |
| 2011/0052803 A1* | 3/2011 | Bao | .......................... | B22F 1/025 427/190 |

(Continued)

OTHER PUBLICATIONS

PCT/US2016/032343 International Search Report and Written Opinion dated Sep. 22, 2016 (10 p.).

*Primary Examiner* — Kaj K Olsen
*Assistant Examiner* — Ross J Christie
(74) *Attorney, Agent, or Firm* — Conley Rose, P.C.

(57) ABSTRACT

A method of fabricating a PCD cutter element including a diamond table including a plurality of coated diamond particles fabricated using an atomic layer deposition (ALD) process.

19 Claims, 13 Drawing Sheets

(56) References Cited

U.S. PATENT DOCUMENTS

2013/0115768 A1* 5/2013 Pore ................ H01L 21/76886
    438/664
2013/0180181 A1 7/2013 Nixon et al.
2014/0291569 A1* 10/2014 Jeon ........................ C01G 9/02
    252/62.9 R

* cited by examiner

CUTTER ELEMENTS FOR DRILL BITS AND METHODS FOR FABRICATING SAME

CROSS-REFERENCE TO RELATED APPLICATIONS

This application is a 35 U.S.C. § 371 national stage application of PCT/US2016/032343 filed May 13, 2016, and entitled "Cutter Elements for Drill Bits and Methods for Fabricating Same," which claims benefit of U.S. provisional patent application Ser. No. 62/160,793 filed May 13, 2015, and entitled "Cutter Elements for Drill Bits and Methods for Fabricating Same," each of which is hereby incorporated herein by reference in their entirety for all purposes.

STATEMENT REGARDING FEDERALLY SPONSORED RESEARCH OR DEVELOPMENT

Not applicable.

BACKGROUND

The disclosure relates generally to cutter elements for drill bits used to drill boreholes in a subterranean formation. More particularly, the disclosure relates to methods for fabricating polycrystalline diamond (PCD) cutter elements for drill bits.

An earth-boring drill bit is typically mounted on the lower end of a drill string and is rotated by rotating the drill string at the surface or by actuation of downhole motors or turbines, or by both methods. With weight applied to the drill string, the rotating drill bit engages the earthen formation and proceeds to form a borehole along a predetermined path toward a target zone.

Earth boring bits used in oilfield drilling operations are frequently one of two types: fixed cutter bits or rolling cutter bits. Fixed cutter drill bits have multiple cutting surfaces that are pressed into and dragged through a formation. This type of bit primarily cuts the formation by shearing and scraping. Rolling cutter bits include one or more rotatable cutters that perform their cutting function due to the rolling movement of the cutters acting against the formation material. The cutters roll and slide upon the bottom of the borehole as the bit is rotated, the cutters thereby engaging and disintegrating the formation material in its path. The rotatable cutters may be described as generally conical in shape and are therefore sometimes referred to as rolling cones or rolling cone cutters. The earth disintegrating action of rolling cutter bits is enhanced by providing a plurality of cutters or cutting elements that extend from each of the rolling cones. Applying weight to the drill bit while rotating forces the cutting elements into engagement with the earth and rotates the cones. A rolling cutter drill bit primarily cuts the formation by compression, crushing, gouging, chipping and scraping. Two common classifications of rolling cutter drill bits include "insert" bits and "tooth" bits. In insert bits, the cutting elements extending from the cones comprise inserts that are press fit into undersized apertures in the cone surface prior to drilling with the bit. In tooth bits, the cutting elements comprise teeth that are milled, cast or otherwise integrally formed with the rolling cone.

While the bit is rotated, drilling fluid is pumped through the drill string and directed out of the face of the drill bit. The fixed cutter bit typically includes nozzles or fixed ports spaced about the bit face that serve to inject drilling fluid into the flow passageways between the several blades. The flowing fluid performs several important functions. The fluid removes formation cuttings from the bit's cutting structure. Otherwise, accumulation of formation materials on the cutting structure may reduce or prevent the penetration of the cutting structure into the formation. In addition, the fluid removes cut formation materials from the bottom of the hole. Failure to remove formation materials from the bottom of the hole may result in subsequent passes by cutting structure to re-cut the same materials, thereby reducing the effective cutting rate and potentially increasing wear on the cutting surfaces. The drilling fluid and cuttings removed from the bit face and from the bottom of the hole are forced from the bottom of the borehole to the surface through the annulus that exists between the drill string and the borehole sidewall. Further, the fluid removes heat, caused by contact with the formation, from the cutter elements in order to prolong cutter element life. Thus, the number and placement of drilling fluid nozzles, and the resulting flow of drilling fluid, may significantly impact the performance of the drill bit.

The cutter elements disposed on the several blades of a fixed cutter bit are typically formed of extremely hard materials and include a layer of polycrystalline diamond ("PCD") material. In the typical fixed cutter bit, each cutter element or assembly comprises an elongate and generally cylindrical support member which is received and secured in a pocket formed in the surface of one of the several blades. In addition, each cutter element typically has a hard cutting layer of polycrystalline diamond or other superabrasive material such as cubic boron nitride, thermally stable diamond, polycrystalline cubic boron nitride, or ultrahard tungsten carbide (meaning a tungsten carbide material having a wear-resistance that is greater than the wear-resistance of the material forming the substrate) as well as mixtures or combinations of these materials. The cutting layer is exposed on one end of its support member, which is typically formed of tungsten carbide.

BRIEF SUMMARY OF THE DISCLOSURE

In an embodiment disclosed herein, a method for fabricating a PCD cutter element, comprising: (a) coating a plurality of diamond particles by directly depositing the coating on an outer surface of each diamond particle of the plurality of diamond particles by atomic layer deposition (ALD); cleaning the coated diamond particles after (a) to remove oxides from coating; using the coated diamond particles after (b) to form the PCD cutter element.

In an alternate embodiment disclosed herein, a method of fabricating a PCD cutter element, comprising: (a) providing a plurality of diamond particles; (b) directly depositing a nickel oxide or cobalt oxide coating on an outer surface of each diamond particle of the plurality of diamond particles by atomic layer deposition (ALD), wherein the nickel oxide coating directly contacts the outer surface of the corresponding diamond particle; (c) removing oxides from the nickel oxide coating after (b) to convert the nickel oxide coating on each diamond particle to a nickel coating on each diamond particle; (d) sintering the coated diamond particles after (c) to form a diamond table; and (e) mounting the diamond table to a tungsten-carbide substrate to form the PCD cutter element.

Embodiments described herein comprise a combination of features and advantages intended to address various shortcomings associated with certain prior devices, systems, and methods. The foregoing has outlined rather broadly the features and technical advantages disclosed herein in order that the detailed description of the invention that follows may be better understood. The various characteristics described above, as well as other features, will be readily apparent to those skilled in the art upon reading the following detailed description, and by referring to the accompanying drawings. It should be appreciated by those skilled in the art that the conception and the specific embodiments disclosed may be readily utilized as a basis for modifying or designing other structures for carrying out the same purposes as disclosed herein. It should also be realized by those skilled in the art that such equivalent constructions do not depart from the spirit and scope set forth in the appended claims.

BRIEF DESCRIPTION OF THE DRAWINGS

For a detailed description of the preferred embodiments of the invention, reference will now be made to the accompanying drawings in which.

DETAILED DESCRIPTION OF THE PREFERRED EMBODIMENTS

Figure 1:
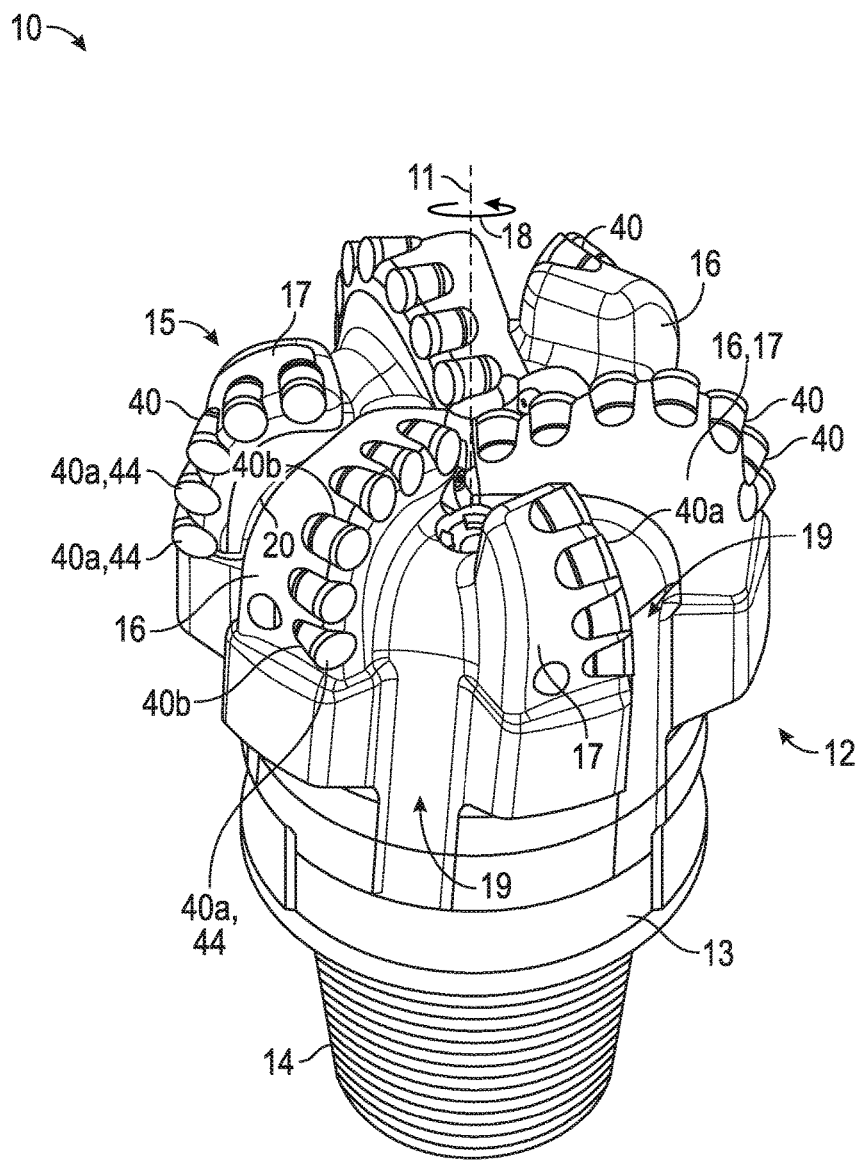
FIG. 1 is a perspective view of an embodiment of a drill bit made in accordance with principles described herein.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices, components, and connections. In addition, as used herein, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis. Any reference to up or down in the description and the claims is made for purposes of clarity, with "up", "upper", "upwardly", "uphole", or "upstream" meaning toward the surface of the borehole and with "down", "lower", "downwardly", "downhole", or "downstream" meaning toward the terminal end of the borehole, regardless of the borehole orientation.

To manufacture PCD tables for cutter elements and bond the tables to the substrate, diamond powder is placed at the bottom of a first mold or can along with a catalyst. The substrate is then placed on top of the diamond powder within the first mold, a second mold or can is placed on top of the substrate, and a seal is formed between the first and second cans. This entire assembly is then subjected to high pressure and temperature conditions to form a PCD cutter element. In general, any Group VIII element (e.g., cobalt, nickel, or iron) can be used as the catalyst, however, in most cases, cobalt (Co) is employed. The catalyst is driven into the interstitial spaces between the diamond grains and promotes intergrowth therein, to form a solid PCD diamond table suitable for use in a cutter element. However, conventional powder mixing techniques do not always result in uniform distribution of the diamond and catalyst powders. Consequently, non-homogenous microstructures may result, potentially reducing the PCD table durability.

The catalyst in the PCD diamond table typically has a coefficient of thermal expansion different than that of the diamond, and thus, thermal stresses experience during drilling operations can undesirably cause cracks to form within the PCD diamond table. A common approach for removing the catalyst from a PCD table is to leach the PCD table to remove some or substantially all of the interstitial catalyst from the PCD lattice structure, thereby transforming the PCD material into thermally stable polycrystalline diamond. Leaching typically involves placing the cutter element in a strong acid bath at an elevated temperature to expose the PCD table to the acid. Suitable acids for leaching include nitric acid, sulfuric acid, hydrofluoric acid, hydrochloric acid, and combinations thereof. Although such leaching acids can aid in removing the catalyst from the PCD table, they can also damage the underlying substrate to which the PCD table is secured. In addition, conventional leaching via acid bath is a relatively time-consuming as it may take days or even weeks to remove a sufficient quantity of the binding agent from the PCD table. This increases the overall time, and associated costs, to manufacture cutter elements and fixed cutter drill bits.

As will be described in more detail below, embodiments described herein offer the potential for more uniform distribution of diamond and catalyst materials, resulting in improved diamond-to-diamond bonding and PCD table durability. In addition, embodiments described herein off the potential for improved PCD table thermal stability, thereby decreasing the need for leaching and/or reducing the time necessary for sufficient leaching.

Figure 2:
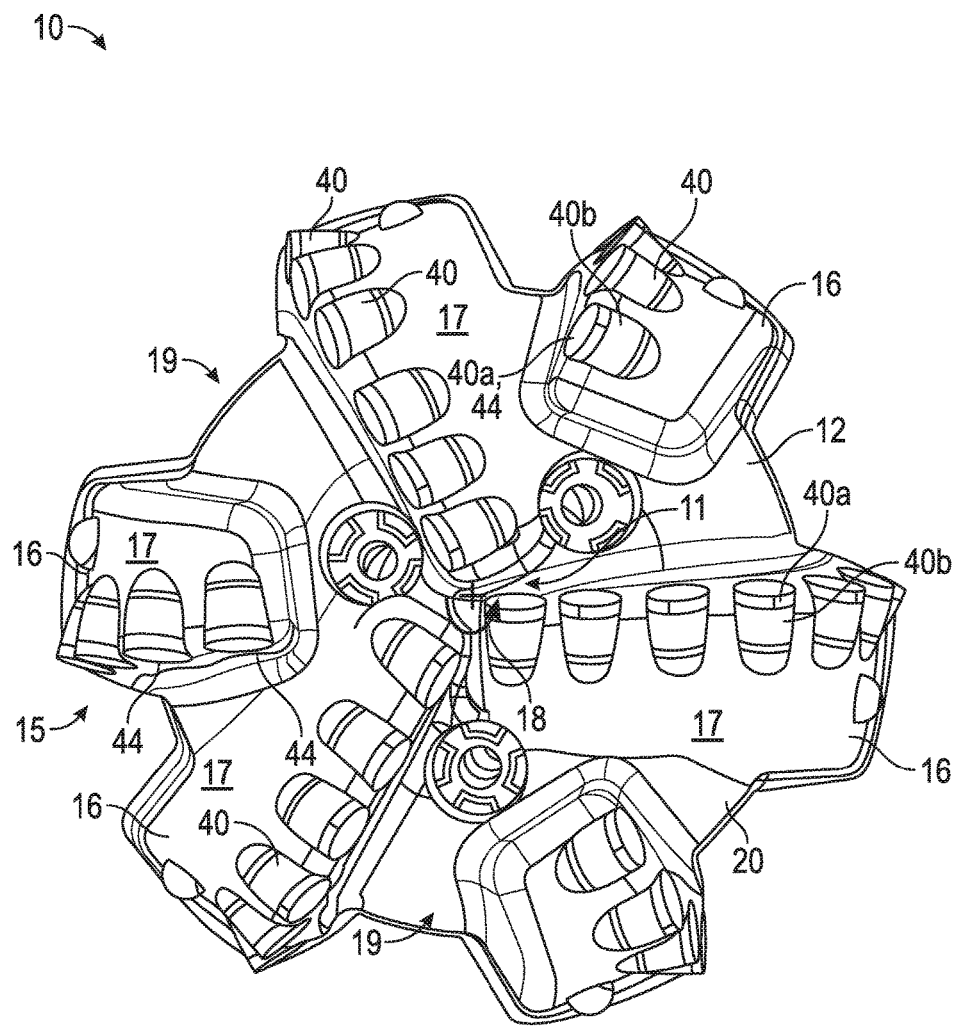
FIG. 2 is an end view of the bit of FIG. 1.

Referring now to FIGS. 1 and 2, an embodiment of a drill bit 10 for drilling a borehole in a subterranean earthen formation is a fixed cutter bit, sometimes referred to as a drag bit. Bit 10 includes a body 12, a shank 13 and a threaded connection or pin 14 for connecting bit 10 to a drill string (not shown), which is employed to rotate the bit in order to drill the metal structure. Body 12 includes a bit face 20, which supports a cutting structure 15 generally disposed on the end of the bit 10 that is opposite pin 14. Bit 10 has a central axis 11 about which bit 10 rotates in the cutting direction represented by arrow 18. Body 12 may be formed in a conventional manner using powdered metal tungsten carbide particles in a binder material to form a hard metal cast matrix. Alternatively, the body can be machined from a metal block, such as steel, rather than being formed from a matrix.

Body 12 may include bores and/or passages that permitting fluid (e.g., lubricating fluid, drilling fluid, etc.) to flow from the drill string into bit 10, and out of drill bit 10 through ports or nozzles disposed in bit face 20. Such bores and passages may serve to distribute fluid around cutting structure 15 to flush away formation cuttings during drilling through the formation and to remove heat from bit 10.

Referring still to FIGS. 1 and 2, cutting structure 15 is provided on face 20 of bit 10 and includes a plurality of blades 16 extending along bit face 20. In this embodiment, the plurality of blades 16 are uniformly circumferentially-spaced about the bit face 20. Blades 16 are integrally formed as part of, and extend perpendicularly outwardly from body 12 and bit face 20. In addition, blades 16 extend generally radially across bit face 20 and longitudinally along a portion of the periphery of bit 10. Each blade 16 has a radially inner end at or proximal axis 11 and a radially outer end proximal shank 13. Blades 16 are separated by fluid flow courses 19. Each blade 16 on bit face 20 provides a cutter-supporting surface 17 to which a plurality of cutter elements 40 are mounted.

Each cutter element 40 includes a layer or table 40a of polycrystalline diamond (PCD) mounted to an elongated and generally cylindrical support member or substrate 40b made of tungsten carbide. Substrate 40b is received and secured in a pocket formed in the surface of the blade 16 to which it is fixed, and table 40a defines a forward facing cutting face 44 positioned and oriented to engage and shear the formation as bit 10 is rotated in the cutting direction 18.

Figure 3B:
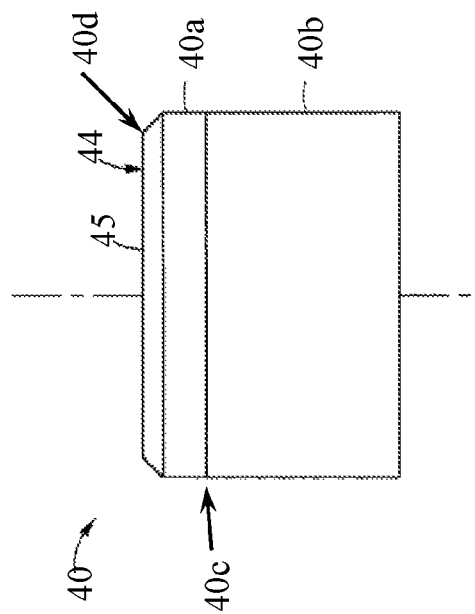
FIGS. 3A and 3B are end and side views, respectively, of one of the PCD cutter elements of the bit of FIG. 1.
Figure 3A:
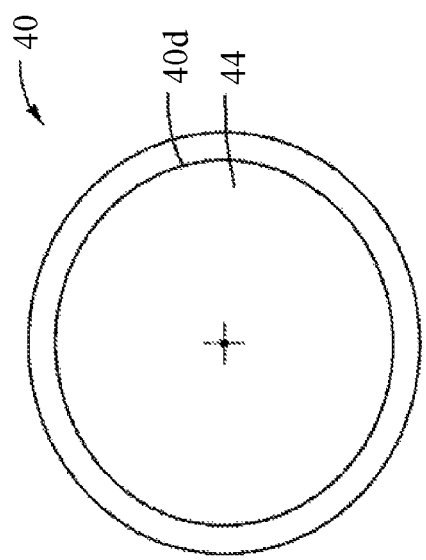

Referring now to FIGS. 3A and 3B, one cutter element 40 is shown, it being understood that each cutter element 40 of bit 10 is the same. As previously described, cutter element 40 includes a PCD table 40a mounted to a cylindrical tungsten carbide (WC) substrate 40b. In general, the interface 40c between PCD table 40a and substrate 40b can be planar or non-planar. The central portion 45 of cutting face 44 is planar in this embodiment, although concave, convex, or ridged surfaces can be employed. In this embodiment, the outer periphery of cutting face 44 comprises a beveled edge 40.

Figure 4:
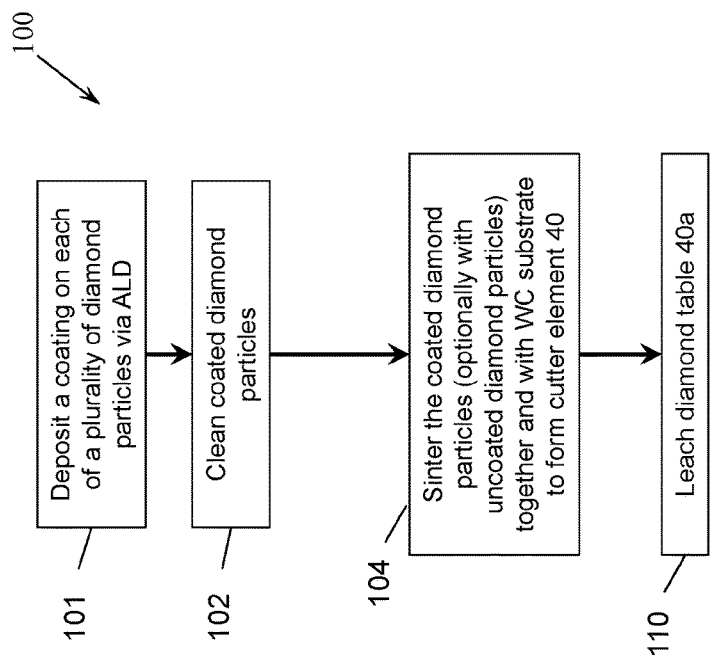
FIG. 4 is a flow chart illustrating an embodiment of a method for making the PCD cutting element of FIGS. 3A and 3B.

Referring now to FIG. 4, an embodiment of a method 100 for manufacturing one cutter element 40 is shown. Starting in block 101, a plurality of diamond particles are coated with a layer, which may also be referred to as a coating, comprising a diamond crystallization catalyst such as Co, CoO, Ni, NiO, or Group VIII element or Group VIII element oxide via atomic layer deposition (ALD). In some embodiment, the coating is deposited in a single step, whereas in other embodiments, the coating comprises a plurality of layers deposited one after the other. In an embodiment of the method 100, at block 101, the coating of the plurality of diamond particles with a crystallization catalyst in block 101 is performed via ALD techniques known in the art. For example, for a Co coating, bis(cyclopentadienyl)cobalt(II) and hydrogen precursors can be used in the ALD process; for CoO, bis(cyclopentadienyl)cobalt(II) and oxygen precursors can be used in the ALD process. One or more additives may optionally be included with the catalyst in the coating. Examples of suitable additives included, without limitation, refractory metals such as tungsten (W), tantalum (Ta), vanadium (V), and combinations thereof.

Figures 5A, 5B:
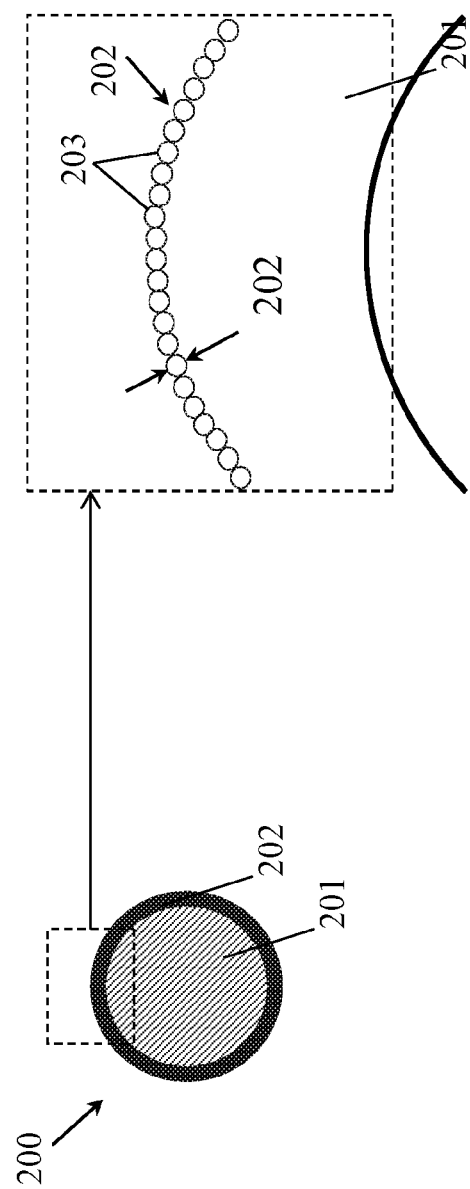
FIGS. 5A and 5B are schematic cross-sectional views of one coated diamond particle fabricated according to the method shown in FIG. 4.

Referring briefly to FIGS. 5A and 5B, one coated diamond particle 200 made according to block 101 is shown, it being understood that each coated diamond particle made according to block 101 is the same. Coated diamond particle 200 includes a diamond particle 201 having an outer surface that is completely and entirely coated with a layer or coating 202 comprising a diamond crystallization catalyst (optionally including an additive) as previously described. Thus, there are no gaps or voids in coating 202. As best shown in FIG. 5B, the catalyst coating 202 comprises a plurality of discrete catalyst particles 203 disposed directly on the outer surface of diamond particle 201. In other words, there is no intermediate layer or coating of material between diamond particle 201 and the coating 202 since particles 203 are in direct contact with the particle 201. In addition, in this embodiment, the coating 202 includes only a single layer of particles 203, with each particle 203 having substantially the same size (e.g., diameter). Consequently, in this embodiment, the coating 202 has a radial thickness $T_{202}$ that is equal to the width or diameter of one particle 203. In other embodiments, the catalyst coating (e.g., coating 202) includes multiple layers of catalyst particles (e.g., particles 203). In some embodiments, the catalyst particles have different sizes, which may fall within a predetermined range or ratio of catalyst particle sizes to the particle 201 size (diameter). Thus, in embodiments, the radial thickness of the catalyst coating (e.g., thickness $T_{202}$) can be greater than the width or diameter of one catalyst particle (e.g., greater than the width or diameter of one catalyst particle 203).

In general, each of the diamond particles 201 employed at block 101 can have any suitable size or diameter. In embodiments described herein, the diamond particles 201 employed in block 101 may have an average size or diameter between about 1.0 micron to 10.0 microns, and in some embodiments about 4.0 microns to 8.0 microns. In general, each catalyst particle 203 employed in block 101 can have any suitable size or diameter, and the range of variation between sizes within a plurality of catalyst particles 203 may be between about +/−1.0 micron to about +/−5.0 microns. In certain embodiments described herein, the plurality of diamond particles 201 employed in block 101 have an average size or diameter between about 1.0 nm to 5.0 nm, and more preferably an average size or diameter between about 1.0 nm to 3.0 nm. Due to the size of the diamond particles 201 and the catalyst particles 203, and resulting thickness $T_{202}$ of coating 202, the coated diamond particles 200 formed in block 101 are generally in the form of a diamond powder. Depending upon the embodiment, different ranges of particle sizes may be employed, for example, 1-8 microns, 2-8 microns 6-18 microns, and 16-36 microns. These particle sizes and the ranges of particle sizes may be used in combinations of different wt % in diamond mixes for PDC cutter synthesis fabricated according to embodiments of the present disclosure.

As previously described, a coating 202 is applied to each diamond particle 201 in block 101 via particle ALD as opposed to other techniques for coating materials such as chemical vapor deposition (CVD). In an embodiment, the coating 202 may be about 1 angstrom in thickness. As is known in the art, CVD is a coating process in which gaseous reagents are used to create a film on particles or other material. However, with CVD, there is no inherent control of the thickness of the film as its growth on the underlying particle or material is dependent on a variety of factors including, without limitation, reaction time, flux of reactants, and reaction temperature. In addition, competing gas phase reactions can produce nanoparticles that are scavenged, often resulting in granular films, and further, precursor feed rates are limited by particle mixing times. Still further, CVD is typically limited to use on particles larger than about 10 μm because van der Waals forces cause smaller particles to fluidize as aggregates, which are "glued" together by the CVD processing.

In contrast, particle ALD allows finer/smaller particles to be coated than does CVD. In addition, ALD techniques use self-limiting surface chemistry that enables control over the coating thickness and produces conformal, non-granular, pinhole-free coatings on primary particle surfaces. In particular, the ALD reaction is split into two sequential surface half reactions, which means the surface reacts with each reagent only until it is completely coated with a new atomic layer. Once this occurs, no further reactions will take place, making the reaction, and the resultant thickness are self-limiting. Consequently, coatings applied by ALD can be as thin as 1 Å. New functional groups are then in place to react with the second reagent. The steps can be repeated until the desired film thickness is achieved. In other words, in the method 100, the block 101 can be repeated to apply the multiple layers or coatings 202 one each diamond particle 201. In addition, ALD is independent of line-of-sight, no competing gas phase reaction occurs, and nearly 100% of the precursor is used, greatly reducing waste.

Referring again to FIG. 4, moving now to block 102, the coated diamond particles (e.g., particles 200) formed in block 101 via ALD are "cleaned" to remove undesirable contaminants from coating 202. In this embodiment, the coated diamond particles are cleaned in the block 102 to remove oxides from coating 202 as oxides may not be desirable in a coating especially if the component comprising that coating is used for high temperature and high pressure applications. In particular, the coated diamond particles are placed in an atmosphere of pure hydrogen (i.e., 100% hydrogen) for a period of time at an elevated temperature preferably between 800° C. and 1200° C. In one embodiment, the coated diamond particles are placed in pure hydrogen at about 950° C. for about 5 minutes, and then the temperature is increased to about 1000° C. and maintained at 1000° C. for about 3 hours. At the end of that process, the temperature is slowly lowered (as opposed to a quench). One or more cycles of cleaning via block 102 can be performed to sufficiently remove contaminants from coating 202.

After cleaning the coated diamond particles in block 102, a cutter element 40 is formed in block 104. In general, the cutter element 40 is formed by simultaneously sintering the cleaned, coated diamond particles to each other and to WC substrate 40b, thereby forming table 40a and bonding table 40a to substrate 40b to form the cutter element 40. More specifically, the cleaned, coated diamond particles, in the form of a diamond powder, are placed at the bottom of a first mold or can, and substrate 40b is then placed on top of the cleaned, coated diamond particles in the first mold. Next, a second mold or can is placed on top of the substrate 40b, and a seal is formed between the first and second cans.

This entire assembly is then subjected to high pressure and temperature conditions to form a PCD cutter element 40 via sintering of the cleaned, coated diamond particles to form table 40a simultaneous with sintering of the cleaned, coated diamond particles with substrate 40b. During the sintering process in block 104, the catalyst particles 203 in the coatings 202 promote intergrowth therein, to form a solid PCD diamond table 40a. The high pressure and temperature conditions also facilitate bonding between the newly formed PCD table 40a and the substrate 40b, thereby resulting in a fully formed PCD cutter element 40. Since each individual diamond particle 201 includes a catalyst coating 202, the catalyst particles 203 are inherently uniformly distributed throughout the diamond powder during block 104. Such uniform distribution of catalyst particles 203 enhances the uniformity and homogeneity of the bonding and crystallization within the table 40a, thereby offering the potential for a more robust, durable diamond table 40a as compared to a conventional diamond table formed by simply mixing catalyst powder with diamond powder prior to sintering.

Although the diamond powder used to form diamond table 40a in block 104 is described as comprising only cleaned, coated diamond particles from block 102, in this embodiment, it should be appreciated that the cleaned, coated diamond particles from block 102 can be mixed with a plurality of uncoated diamond particles and/or with a plurality of cleaned, coated diamond particles having a different coating 202 prior to forming cutter element 40 in block 104. In other words, the diamond table 40a formed in block 104 can be formed from a diamond powder comprising cleaned, coated diamond particles from block 102 and uncoated diamond particles, diamond powder comprising cleaned, coated diamond particles from block 102 cleaned, coated diamond particles having a different coating 202, or combinations thereof. In such embodiments, selected sizes for the diamond particles mixed together may be preferred; this may be based on a percentage of particles with a particular measurement, or may be a ratio of particle sizes. For example, in one embodiment, a first plurality of cleaned, coated diamond particles having an average size or diameter of about 1.0 to 3.0 microns are mixed with a second plurality of cleaned, coated diamond particles having an average size or diameter of about 4.0 to 8.0 microns. In some embodiments, the weight of the first and the second pluralities of diamond coated particles may be equal, and in alternate embodiments the weight of one plurality may be greater than the other. For most applications, the cleaned, coated diamond powders that are mixed together to form the diamond table preferably have average sizes or diameters that are within 1.0 to 2.0 microns of each other. In one embodiment where cleaned, coated diamond particles from block 102 are mixed with uncoated diamond particles prior to forming the cutter element 40 in block 104, the mixture used to form the table 40a in block 104 preferably comprises about 10 wt. % cleaned, coated diamond particles from block 102 and about 90 wt. % uncoated diamond particles that have an average size or diameter ranging from about 20.0 to 40.0 microns.

Moving now to block 110, the diamond table 40a is leached (e.g., acid leached) to remove at least some of the catalyst particles 203 from the diamond table 40a. Since each individual diamond particle 201 includes a relatively thin catalyst coating 202, the volume and concentration of the catalyst particles 203 in the diamond table 40a formed in block 104 are generally less as compared to a conventional diamond table formed by mixing diamond powder and catalyst powder. Consequently, in embodiments described herein, the need for leaching the diamond table 40a in block 110 is generally less than for a similarly sized conventional diamond table. Accordingly, in some embodiments, the quantity and concentration of the catalyst particles 203 in diamond table 40a is sufficiently low such that the length of time for leaching can be decreased and/or leaching can be completely eliminated (i.e., block 110 can be eliminated). This offers the potential to decrease the overall time to manufacture cutter element 40 as compared to a conventional PCD cutter element, as well as reduce the likelihood of inadvertently damaging the underlying WC substrate 40b.

In one example, the coated diamond particles 1302 may be referred to as the inner coated polycrystalline diamond particles, and the uncoated nanocrystalline diamond particles may be referred to as the outer polycrystalline diamond particles. The "outer" term refers to the presence of these particles which may be on the outermost surface of the coated diamond particles 1302. The outer polycrystalline diamond particles are generally smaller, nanocrystalline diamond particles, and the inner coated polycrystalline diamond particle is a generally larger micron polycrystalline diamond particle. The outer nanocrystalline diamond particles may also be referred to herein as "nanoparticles" or "nano-satellited diamond particles." When sintered under high pressure and high temperature (HPHT) conditions, such outer nanocrystalline diamond coated diamond particles exhibit enhanced bonding between diamond grains within the table 40a, by generating a greater number of grain boundaries and diamond-to-diamond bonds per unit of surface area as compared to some conventional PCD materials and cutter elements. Consequently, tables 40a offers the potential for increased density and thermal stability.

To further illustrate various illustrative embodiments of the present invention, the following examples are provided.

Example I

A plurality of diamond particles were analyzed to assess thermal stability in an ALD environment. The diamond particles had an average diameter of about 500 nm. First, the specific surface area of the diamond particles was calculated by the Brunauer-Emmett-Teller (BET) method from the $N_2$ adsorption isotherms obtained at −196° C. Before starting the adsorption measurements, each sample was outgassed by heating under vacuum at 200° C. for 5 hours. The surface area of the diamond particles was calculated to be 8.6 m²/g.

Figure 6:
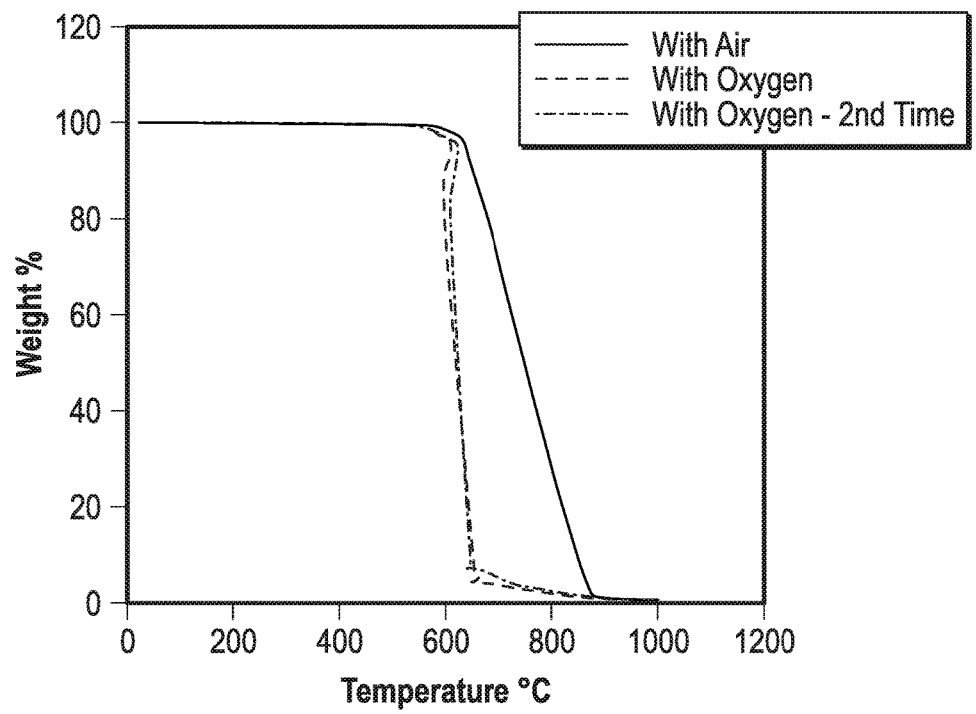
FIG. 6 is a graph illustrating thermogravimetricanalysis (TGA) of samples of uncoated diamond particles fabricated according to embodiments described herein.
Figure 7:
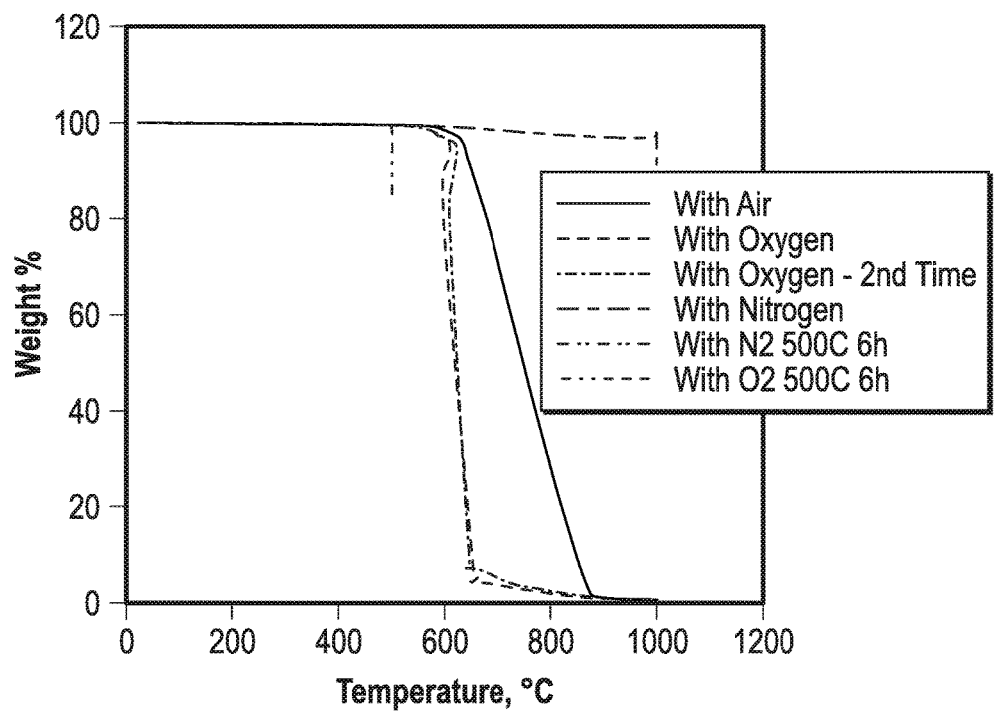
FIG. 7 is a graph illustrating thermogravimetricanalysis (TGA) of samples of uncoated diamond particles fabricated according to embodiments described herein.

The thermal stability of the diamond particles in the ALD environment was assessed via thermos gravimetric analysis (TGA). FIGS. 6 and 7 are graphs illustrating the thermos gravimetric analysis (TGA) analysis of the diamond particles. As shown in FIGS. 6 and 7, the 500 nm diamond particles began to decompose at about 600° C. in air, and the decomposition was faster in the atmosphere of oxygen as compared to the nitrogen. As shown in FIG. 7, the 500 nm diamond particles were stable in oxygen at temperature less than 500° C. for up to 3 hr. Accordingly, the results of TGA indicated it would be acceptable to use oxygen as precursor when the reaction temperature is lower than 500° C.

Example II

Diamond particles were coated with CoO via ALD and then analyzed. The ALD process was carried out in a fluidized bed reactor with bis(cyclopentadienyl)cobalt(II) and oxygen used as precursors to apply the CoO coating to the diamond particles. The ALD reaction was conducted at a temperature as high as 450° C. In a typical ALD run, 2 grams of diamond particles were loaded into the reactor. Various coating cycles were carried out using different dimensions of diamond particle size and density, concentrations of diamond volume, diamond weight, coating volume, and coating weight and weight percent. The ALD coated samples were characterized by X-ray photoelectron spectroscopy (XPS) for the composition of cobalt, inductively coupled plasma-atomic emission spectroscopy (ICP-AES) was employed to determine cobalt content, and TEM was used for the morphology of the particles after coating.

Figure 8:
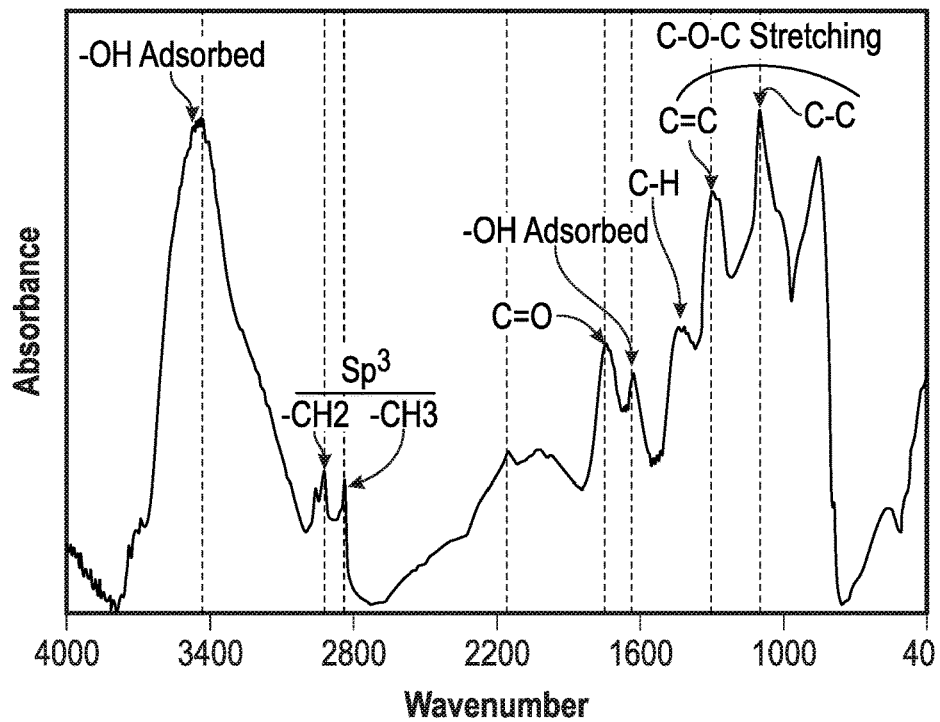
FIG. 8 is a graph of the Fourier Transform Infrared Spectrometer (FTIR) analysis of uncoated diamond particles fabricated according to embodiments described herein.

FIG. 8 is an FTIR graph illustrating the functional groups present on the diamond particles, which is necessary to initiate CoO ALD coating process. As shown in FIG. 8, the functional groups on the 500 nm diamond particle surface included C=C, C—C, C—H, C—O, CH2, and CH3.

Example III

Diamond particles were coated with Co and CoO via ALD and then analyzed. Both Co or CoO ALD coatings were employed by adjusting the precursor dose time for each type of coating. Bis(cyclopentadienyl)cobalt(II) and hydrogen were used as precursors for the Co coating. Bis(cyclopentadienyl)cobalt(II) and oxygen were used as precursors for the CoO coating. The reaction temperature range was 400-450° C. for both the Co and CoO coatings.

Figure 9:
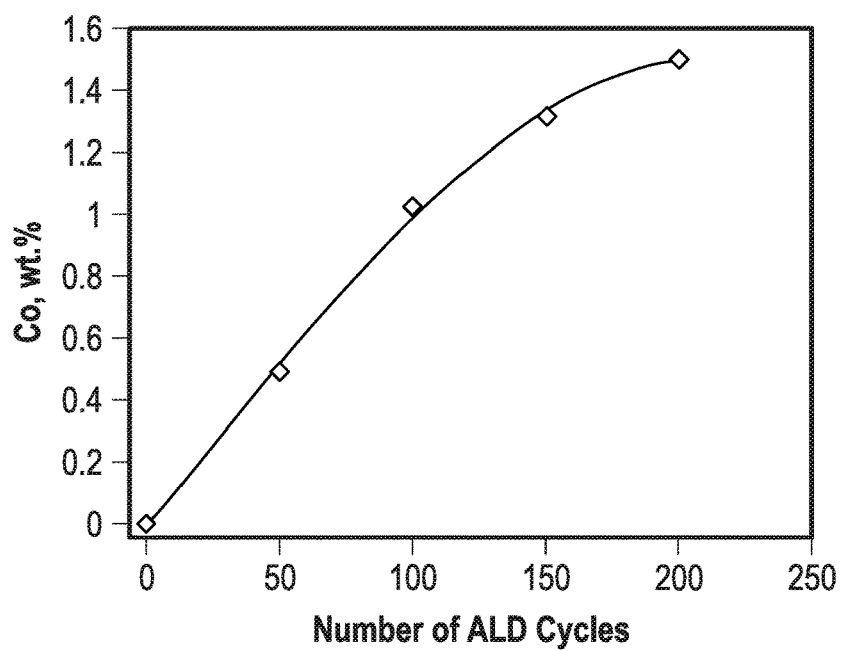
FIG. 9 is a graph of the inductively coupled plasma-atomic emission spectroscopy (ICP) analysis of cobalt ALD coated diamond particles.
Figure 10:
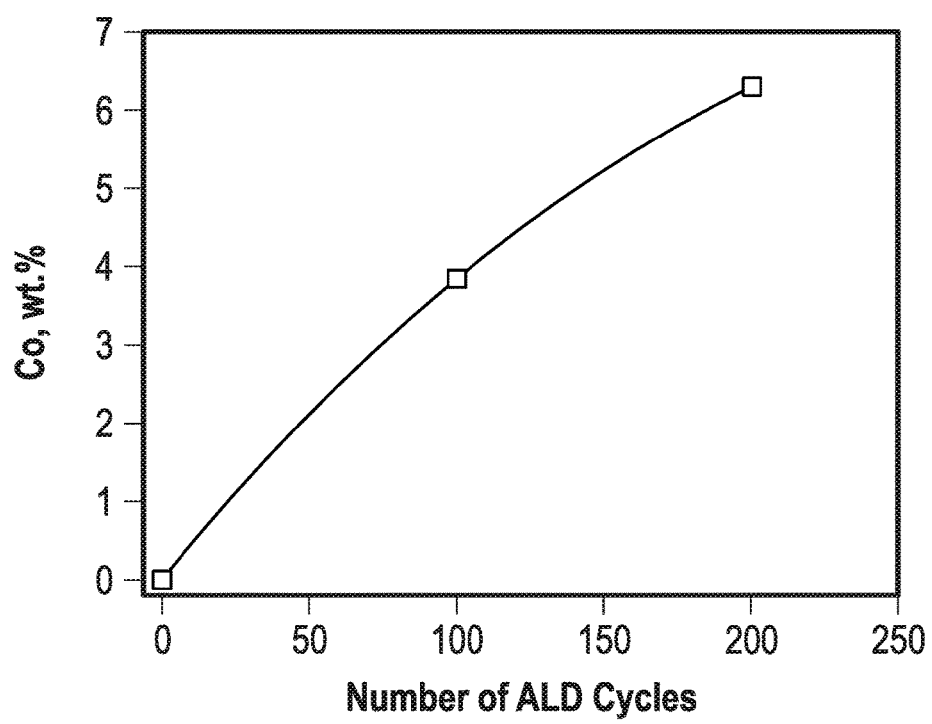
FIG. 10 is a graph of ICP results indicating that the content of Co on 500 nm diamond particles increased with the increase of the number of CoO ALD coating cycles using bis(cyclopentadienyl)cobalt(II) and oxygen as precursors.

FIG. 9 is a graph of an ICP analysis of the ALD fabricated Co coated diamond particles. The ICP results in FIG. 9 indicated that the content of Co on 500 nm diamond particles increased with the increase of the number of Co ALD coating cycles using bis(cyclopentadienyl)cobalt(II) and hydrogen as precursors. FIG. 10 is a graph of an ICP analysis of the ALD fabricated CoO coated diamond particles. The ICP results in FIG. 10 indicated that the content of Co on 500 nm diamond particles increased with the increase of the number of CoO ALD coating cycles using bis(cyclopentadienyl)cobalt(II) and oxygen as precursors.

FIGS. 9 and 10 indicated that both Co and CoO coatings can be deposited directly on the outer surface of the diamond particles without an intermediate seed layer. For Co ALD, the loading of cobalt was about 1.5 wt. % after 200 cycles of ALD coating. For CoO ALD, the growth rate is much higher; the loading of Co was about 6 wt. % after 200 cycles of ALD coating.

Figure 11:
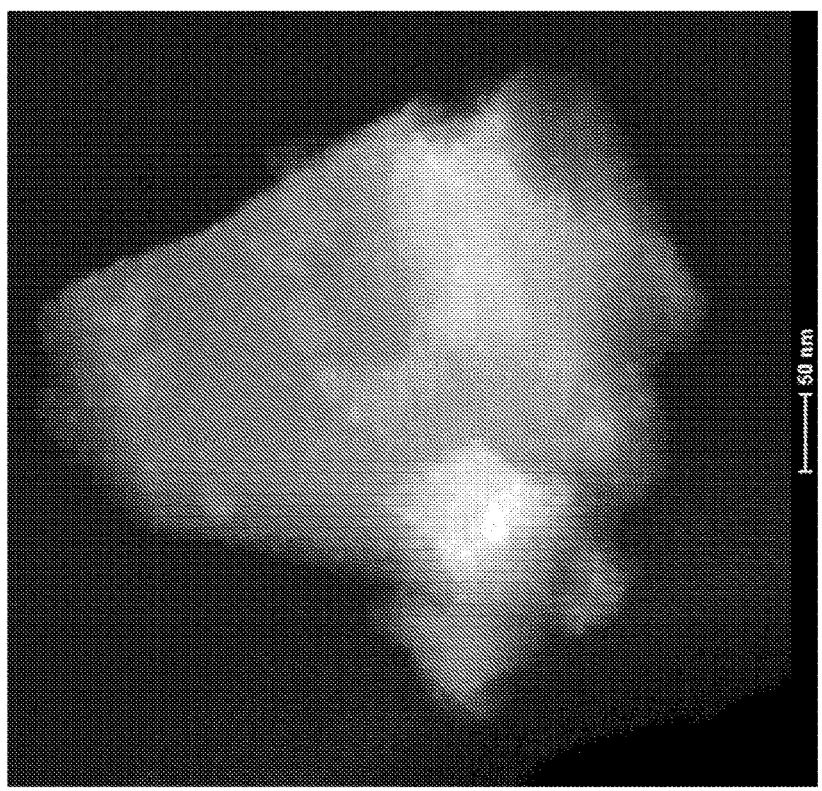
FIG. 11 is a transmission electron microscopy (TEM) image of Co nanoparticles with a uniform particle size distribution that were deposited on diamond particle surfaces using ALD.

FIG. 11 is a TEM image of the Co nanoparticles deposited on a diamond particle via ALD. FIG. 11 illustrates Co nanoparticles with a uniform particle size distribution were deposited on 500 nm diamond particle surfaces after 200 cycles of Co ALD. In this embodiment, the particle size of Co nanoparticles is about 2 nm.

Figure 12:
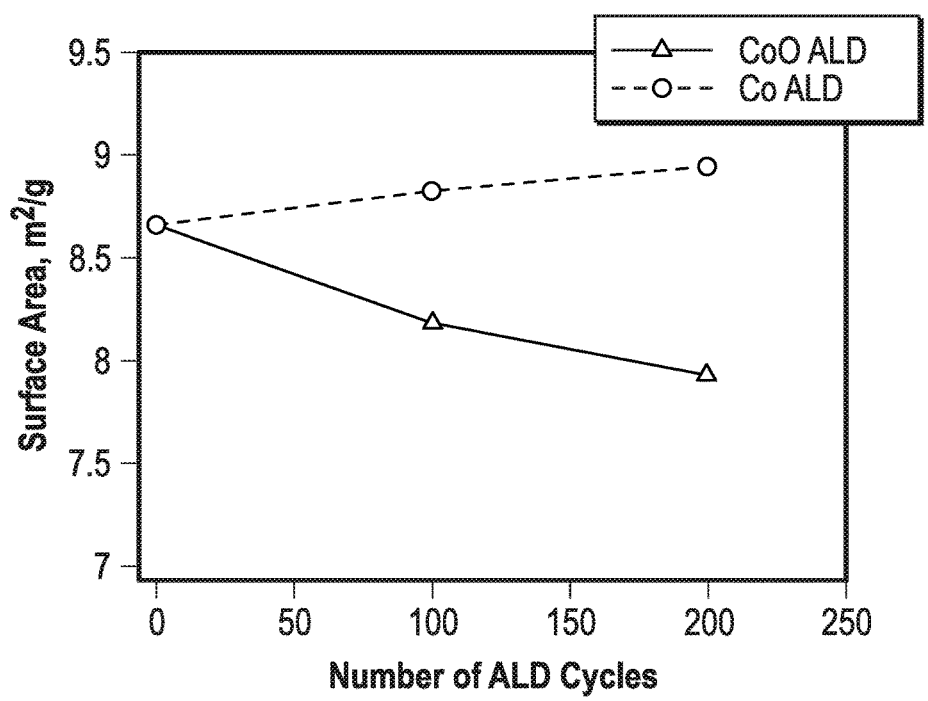
FIG. 12 is a graph of the Brunauer-Emmet-Teller (BET) surface area of the 500 nm diamond particles coated with various cycles of Co or CoO ALD.

FIG. 12 is a graph using the Brunauer-Emmett-Teller (BET) method of the surface area of the 500 nm diamond particles coated with various cycles of Co or CoO ALD. The surface area of the particles with various cycles of Co or CoO ALD coating was estimated by the BET method from the $N_2$ adsorption isotherms obtained at −196° C. As shown in FIG. 11, the surface area of the CoO ALD coated diamond particles decreased slightly with the increase in the number of ALD coating cycles. In an embodiment, this may be due to the presence of larger coated diamond particles due to the ALD film coating and slight particle aggregation, and the CoO ALD film has a higher density than the diamond particle substrate. All these factors will contribute to a lower surface area. For the Co ALD coated diamond particles, however, the surface area increased with the increase in the number of Co ALD coating cycles. The above-mentioned similar effects existed during the Co ALD coating process, and they could result in a lower surface area of the coated particles. However, the main difference between Co ALD and CoO ALD is that Co nanoparticles were formed in the Co ALD process, instead of a continuous layer of film. From the TEM imaging, it was observed that the Co was loaded as ~2 nm particles, which contributed to a higher surface area of the samples. In an alternate embodiment, for NiO ALD, the NiO coating was deposited on a plurality of 1-3 micron diamond particles. Up to about 2 wt. % Ni on 1-3 microns diamond particles can be achieved. As used herein, the weight percent of a coating may be defined as the percentage of the coating weight as compared to the total weight of the particle, this may also be referred to as an average weight percent, measured across the plurality of coated diamond particles.

Figure 13A:
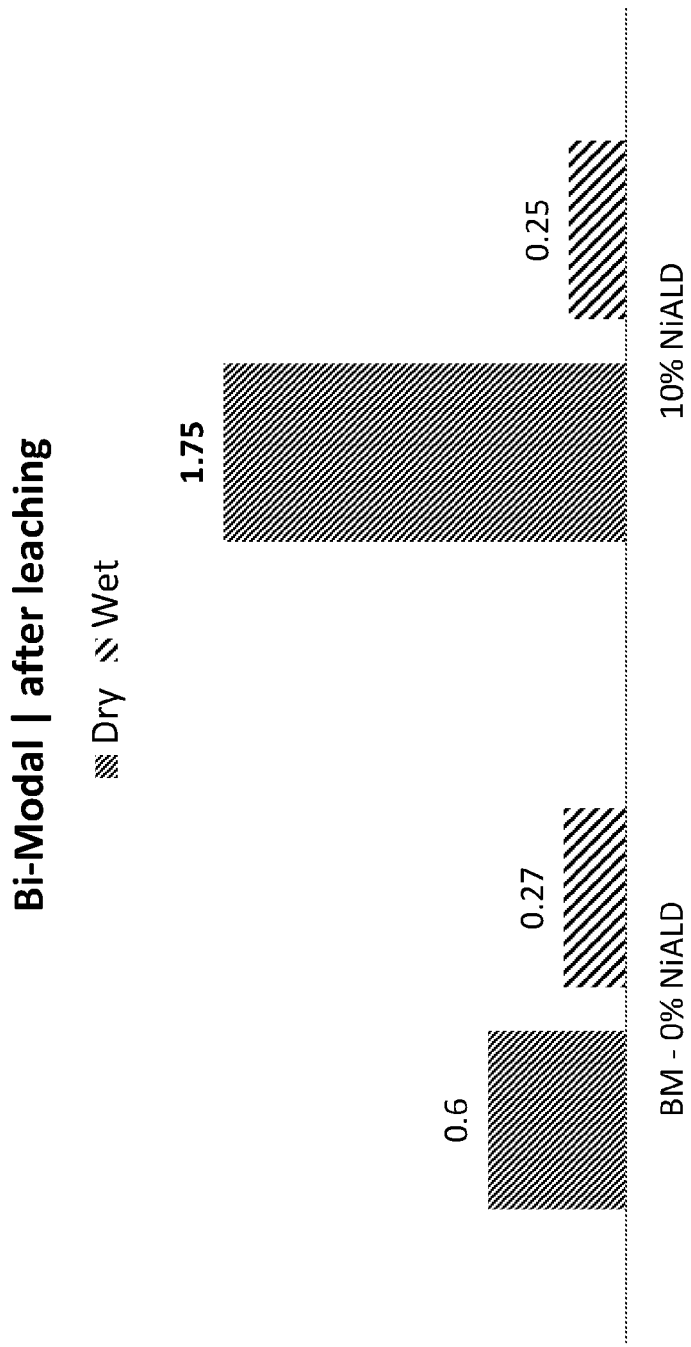
FIGS. 13A-13C illustrate abrasion results for PCD cutter elements fabricated according to embodiments of the present disclosure.
Figure 13B:
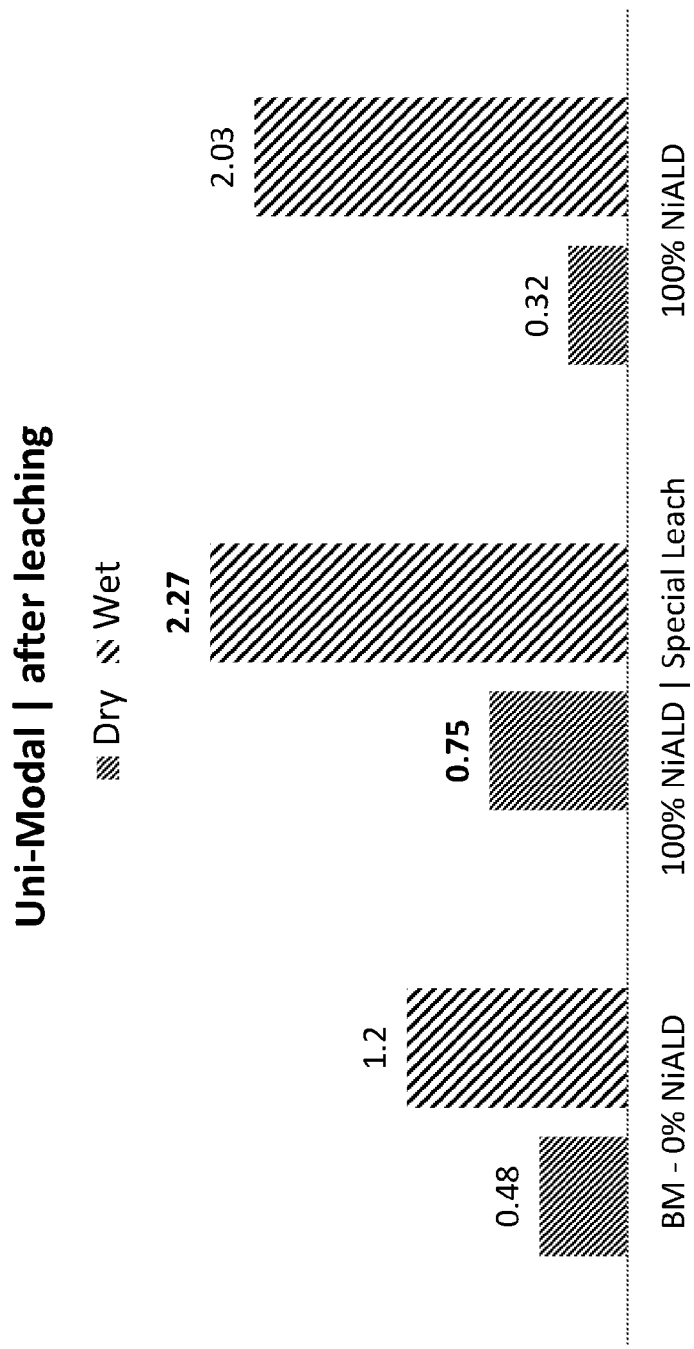
Figure 13C:
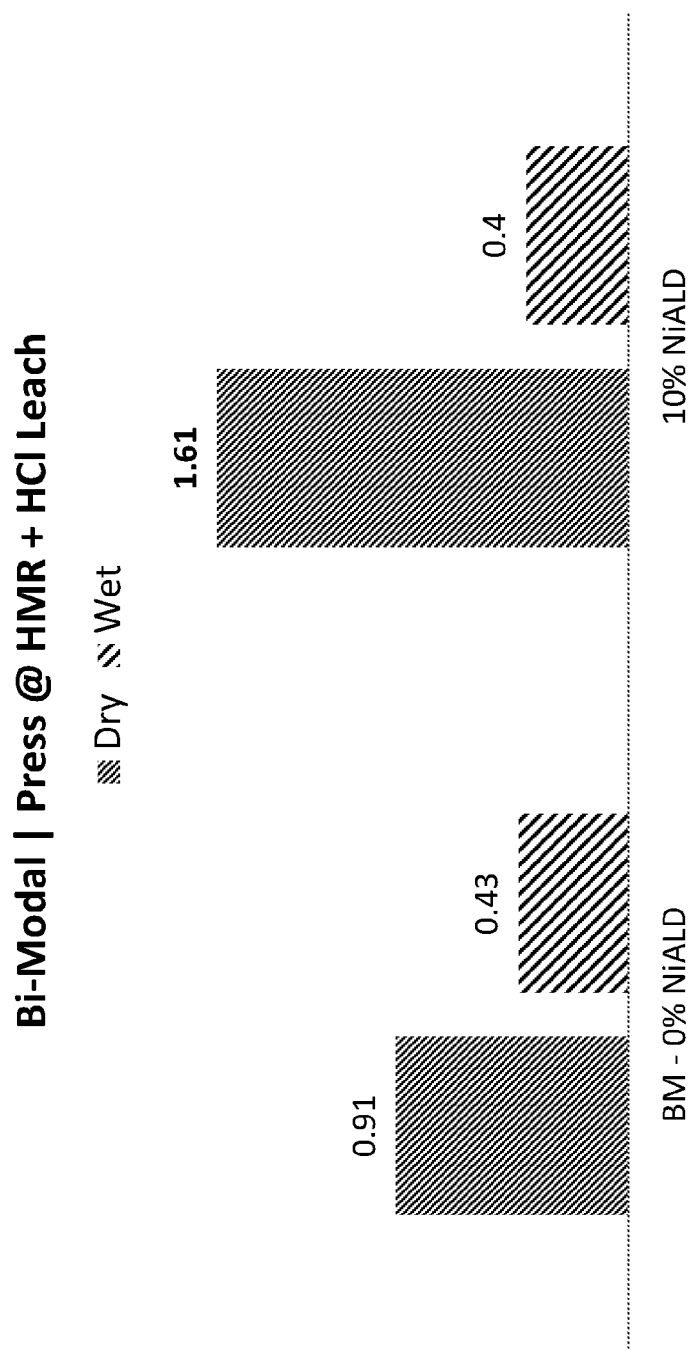

FIGS. 13A-13C illustrate abrasion results for PCD cutter elements fabricated according to embodiments of the present disclosure. Samples of various compositions, as shown in Table 1, underwent abrasion testing under both wet and dry conditions. FIG. 13A illustrates the abrasion results for bi-modal samples, FIG. 13B illustrates abrasion results for uni-modal samples, and FIG. 13C illustrates abrasion results for bi-modal samples with a HCl leach, the compositions are as noted below. A bi-modal sample comprises 10% wt. % as indicated below, "UC" indicates uncoated diamond particles, NiALD is Nickel Oxide ALD in a hydrogen-reduced process, and the "BM" samples are those that were processed without any ALD coated diamond feedstock.

TABLE 1

| Sample | Type | Composition | Process | Dry | Wet |
|---|---|---|---|---|---|
| 10% ALD | BiModal | 10% 4-8 u NiALD + 90% 22-36 u UC | Pressed @STN + HCl Leach (HL) | 1.75 | 0.25 |
| BM- 0% ALD | BiModal | 10% 4-8 u UC + 90% 22-36 u UC | Pressed @STN + HCl Leach (HL) | 0.60 | 0.27 |
| 100% ALD | UniModal | 100% 4-8 u NiALD | Pressed @ HMR special leaching | 0.75 | 2.27 |
|  |  |  | Pressed @ HMR + HCl Leach (HL) | 0.32 | 2.03 |
| BM- 0% ALD | UniModal | 100% 4-8 u UC | Pressed @ HMR + HCl Leach (HL) | 0.48 | 1.20 |
| 10% ALD | BiModal | 10% 4-8 u NiALD + 90% 22-36 u UC | Pressed @ HMR + HCl Leach (HL) | 1.61 | 0.40 |
| BM- 0% ALD | BiModal | 10% 4-8 u UC + 90% 22-36 u UC | Pressed @ HMR + HCl Leach (HL) | 0.91 | 0.43 |

In the manner described, an angstrom-thick layer or coating of in-situ catalyst is applied to submicron or nanocrystalline diamond particles via atomic layer deposition (ALD). The coated diamond particles are then cleaned and used to form a diamond table for a cutter element. Although the cleaned, coated diamond particles are described as being used for forming diamond tables for cutter elements used in PDC drill bits, it should be appreciated that embodiments of the cleaned, coated diamond particles described herein can be sintered or otherwise used to form other devices or products (e.g., other types of downhole tools, drill bits, etc.), particularly devices and products that experience high-temperature and/or high-pressure environments.

While preferred embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the invention. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

The invention claimed is:

1. A method for fabricating a PCD cutter element, comprising:
   (a) coating, by atomic layer deposition (ALD), a plurality of diamond particles by directly depositing the coating on an outer surface of each diamond particle of the plurality of diamond particles to form a plurality of coated diamond particles;
   (b) removing oxides from the plurality of coated diamond particles after (a);
   (c) forming a PCD cutter element using the coated diamond particles after (b) by sintering the coated diamond particles together to form a diamond table and leaching the diamond table after sintering the coated diamond particles to remove one or more metals from the diamond table.

2. The method of claim 1, wherein (c) comprises leaching the diamond table to remove cobalt from the diamond table.

3. The method of claim 1, wherein the coating deposited in (a) comprises nickel (Ni) or nickel oxide (NiO).

4. The method of claim 1, wherein the plurality of diamond particles have an average size less than about 500 microns.

5. The method of claim 1, wherein (b) comprises exposing the coated diamond particles to pure hydrogen at an elevated temperature.

6. The method of claim 5, wherein the elevated temperature is between about 800° C. and about 1200° C.

7. The method of claim 6, wherein the elevated temperature is about 1000° C.

8. The method of claim 1, wherein the ALD is performed using a precursor comprising bis(cyclopentadienyl)cobalt (II) and hydrogen.

9. The method of claim 1, wherein the ALD is performed using a precursor comprising bis(cyclopentadienyl)cobalt (II) and oxygen.

10. The method of claim 1, wherein the ALD is performed using a precursor comprising bis(cyclopentadienyl)nickel (II) and hydrogen.

11. The method of claim 1, wherein the ALD is performed using a precursor comprising bis(cyclopentadienyl)nickel (II) and oxygen.

12. The method of claim 1, wherein the coating comprises a plurality of particles, wherein the particles of the coating have an average diameter of about 2.0 nm.

13. A method of fabricating a PCD cutter element, comprising:
   (a) providing a plurality of diamond particles;
   (b) directly depositing a nickel oxide coating on an outer surface of each diamond particle of the plurality of diamond particles by atomic layer deposition (ALD), wherein the nickel oxide coating directly contacts the outer surface of the corresponding diamond particle;
   (c) removing oxides from the nickel oxide coating after (b) by exposing the coated diamond particles to pure hydrogen at an elevated temperature between about 800 and about 1200° C. to convert the nickel oxide coating on each diamond particle to a nickel coating on each diamond particle;
   (d) sintering the coated diamond particles after (c) to form a diamond table; and
   (e) mounting the diamond table to a tungsten-carbide substrate to form the PCD cutter element.

14. The method of claim 13, further comprising (f) leaching the diamond table after (e) to remove one or more metals.

15. The method of claim 14, wherein the plurality of diamond particles have an average diameter from about 1 micron to about 3 microns.

16. The method of claim 14, wherein the plurality of diamond particles have an average diameter from about 4 microns to about 8 microns.

17. The method of claim 14, wherein the elevated temperature is about 1000° C.

18. The method of claim 14, wherein (f) comprises leaching the diamond table after (e) to remove one or more metals that infiltrate into the diamond table from the tungsten carbide substrate.

19. The method of claim 13, wherein (c) further comprises:
   (c1) exposing the exposing the coated diamond particles to pure hydrogen at an elevated temperature between about 800 and about 1200° C.;
   (c2) lowering the temperature after (c1); and then
   (c3) repeating steps (c1) and (c2) at least once.

* * * * *